(12) United States Patent
Jeon et al.

(10) Patent No.: US 8,539,325 B2
(45) Date of Patent: Sep. 17, 2013

(54) PARITY GENERATING APPARATUS AND MAP APPARATUS FOR TURBO DECODING

(75) Inventors: In San Jeon, Daejeon (KR); Hyuk Kim, Daejeon (KR); Han Jin Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 334 days.

(21) Appl. No.: 12/972,289

(22) Filed: Dec. 17, 2010

(65) Prior Publication Data

US 2011/0154149 A1     Jun. 23, 2011

(30) Foreign Application Priority Data

Dec. 18, 2009  (KR) .......................... 10-2009-0127538
Nov. 18, 2010  (KR) .......................... 10-2010-0115080

(51) Int. Cl.
    *G06F 11/00*     (2006.01)
(52) U.S. Cl.
    USPC ........................................ 714/801; 714/792
(58) Field of Classification Search
    None
    See application file for complete search history.

(56) References Cited

U.S. PATENT DOCUMENTS

| | | | |
|---|---|---|---|
| 6,307,901 B1 | 10/2001 | Yu et al. | |
| 7,168,030 B2 | 1/2007 | Ariyoshi | |
| 8,230,307 B2 * | 7/2012 | Valadon | ........................ 714/792 |
| 8,250,430 B2 * | 8/2012 | Nishi | ............................ 714/755 |
| 2007/0300138 A1 * | 12/2007 | Motwani | ....................... 714/792 |
| 2009/0300463 A1 * | 12/2009 | Purkovic et al. | ............... 714/755 |

OTHER PUBLICATIONS

Steven S. Pietrobon et al., "A Simplification of the Modified Bahl Decoding Algorithm for Systematic Convolutional Codes", ISITA, 1996, pp. 1-5.
Toni Levanen et al., "Efficient Parity Bit Estimation for Turbo Codes", SPAW, 2009, pp. 663-667, IEEE.

* cited by examiner

*Primary Examiner* — Christopher McCarthy

(57) ABSTRACT

An apparatus for generating a parity bit for turbo decoding, and a MAP (Maximum A Posteriori) apparatus are provided. The apparatus for generating a parity bit for turbo decoding includes: a index converter calculating forward and reverse state matrices with respect to a parity bit by maintaining or changing the relationship between the forward and reverse state matrices with respect to information bits and input symbols according to an encoder state; and a parity calculation unit calculating a parity bit by using the forward and reverse state matrices calculated by the parity state matric calculation unit.

9 Claims, 4 Drawing Sheets

PARITY GENERATING APPARATUS AND MAP APPARATUS FOR TURBO DECODING

CROSS-REFERENCE TO RELATED APPLICATIONS

This application claims the priority of Korean Patent Application Nos. 10-2009-0127538 filed on Dec. 18, 2009 and 10-2010-0115080 filed on Nov. 18, 2010, in the Korean Intellectual Property Office, the disclosures of which are incorporated herein by reference.

BACKGROUND OF THE INVENTION

1. Field of the Invention

The present invention relates to a parity generating apparatus for generating a parity bit in order to improve a decoding performance in turbo decoding, and an MAP apparatus.

2. Description of the Related Art

An error correction technique using a turbo code was first published by Claude Berrou in 1993, opening a new chapter in the error correction field. The error correction capability of the turbo code has characteristics such that a BER (Bit Error Rate) performance is improved according to the number of repetitions thereof. In addition, it has been known that a sufficient amount of repetition would achieve a level of error correction as close as the channel capacity method presented by C. E. Shannon.

A turbo decoder is implemented based on a MAP (Maximum A Posteriori) algorithm or a SOVA (Soft Output Viterbi Algorithm). In general, in terms of calculation complexity, a turbo decoder using the MAP scheme is two to four-fold more complicated than the turbo decoder using the SOVA scheme, and has a better BER by 0.5 dB to 0.7 dB in terms of performance.

Recently, a turbo coder and turbo decoder have been adopted for a system aimed at a high speed data transmission requiring a low BE, such as an LTE (Long Term Evolution) standard, a next-generation mobile communication system, or the like, as well as the existing mobile communication system, and also adopted as a standard in an error correction field of a digital broadcast communication system.

Meanwhile, S. S. Pietrobon has proposed a turbo decoder having a structure using a corrected LogMAP algorithm obtained by simplifying a LogMAP scheme so as to make it easily implementable by hardware. In this case, because the implementation of the existing LogMAP scheme has a complicated configuration, a SubLogMAP scheme, a MaxLog-MAP scheme, and the like, have been also proposed in order to reducing the amount of calculation, while submitting to degradation of performance.

S. S. Pietrobon has simplified the existing LogMAP algorithm by using an E function.

SUMMARY OF THE INVENTION

An aspect of the present invention provides an apparatus for generating a parity bit in order to obtain improved performance while reducing a repeated decoding operation, and a MAP apparatus for turbo decoding.

According to an aspect of the present invention, there is provided an apparatus for generating a parity bit for turbo decoding, including: a index converter calculating forward and reverse state matrices with respect to a parity bit by maintaining or changing the relationship between the forward and reverse state matrices with respect to information bits and input symbols according to an encoder state; and a parity calculation unit calculating a parity bit by using the forward and reverse state matrices which have been calculated by the parity state matric calculation unit.

The forward and reverse state matrices may be calculated according to a MAP (Maximum A Posteriori) algorithm.

The index converter may maintain or change the relationship between the forward and reverse state matrices and the input symbols by using a table regarding the relationship among the input symbols according to the encoder state, the parity bit, and the decoded state.

The parity calculation unit may calculate the parity bit by employing an LLR (Log Likelihood Ratio) scheme.

According to another aspect of the present invention, there is provided a MAP apparatus including: a first state matric calculation unit obtaining forward and reverse state matrices with respect to input symbols; an information calculation unit calculating information bits by using the forward and reverse state matrices calculated by the first state matric calculation unit; a index converter calculating forward and reverse state matrices with respect to a parity bit by maintaining or changing the relationship between the forward and reverse state matrices with respect to information bits and input symbols according to an encoder state; and a parity calculation unit calculating a parity bit by using the forward and reverse state matrices calculated by the index converter.

The forward and reverse state matrices may be calculated according to the MAP (Maximum A Posteriori) algorithm.

The first state matric calculation unit may include: a branch matric calculator calculating a branch matric by using a correlation of branches of a trellis diagram structure of the input symbols; a first calculator calculating a forward state matric of a corresponding period by using the calculated branch matric; and a second calculator calculating a reverse state matric of the corresponding period by using the calculated branch matric.

The parity calculation unit and the information calculation unit may calculate the parity bit and the information bits by employing the LLR (Log Likelihood Ratio) scheme.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
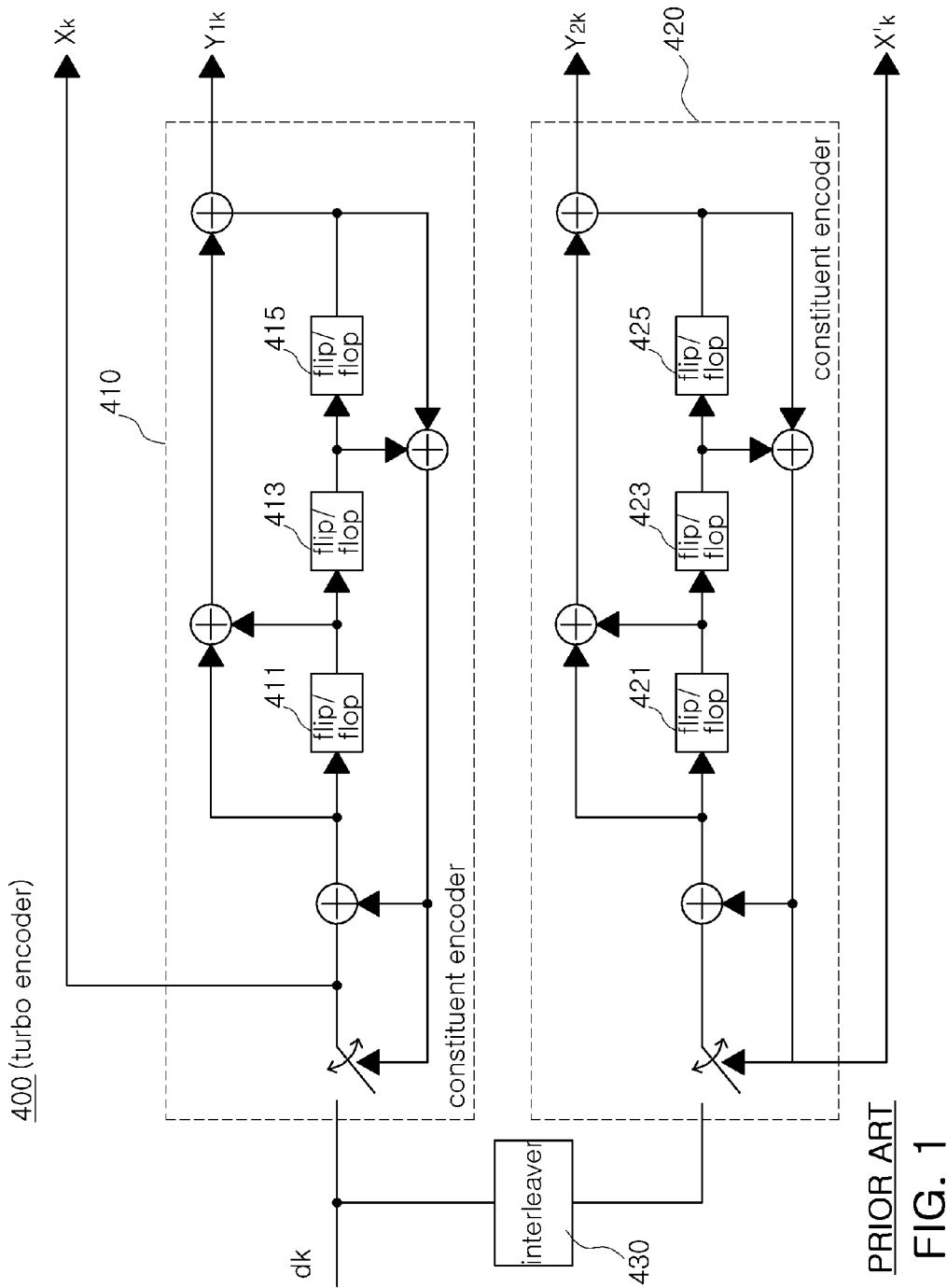
FIG. 1 is a schematic block diagram illustrating the structure of a turbo encoder used in the conventional 3GPP (3rd Generation Partnership Project) LTE (Long-Term Evolution)

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of any other elements.

Before describing a parity generating apparatus and MAP apparatus for turbo decoding according to an exemplary embodiment of the present invention, a novel method for deriving a state matric with respect to a parity bit by analyzing a MAP algorithm of Pietrobon will be proposed.

First, variables included in a numerical formula used in analyzing the MAP algorithm of Pietrobon have meanings as follows.

k: Time or data sequence
dk: Information bits at time k (data bits which are not coded)
Yk: Parity bit at time k (coded bit)
Sk: State of encoder at time k
xk: Reception symbols of dk
yk: Reception symbols of Yk
Rk: reception symbols made up of xk and yk
pk, qk: noise included in reception symbols Sequence $R_1^N$, Rk, xk, and yk of the reception symbols are represented by Equation 1 shown below:

$$R_1^N = (R_1, R_2, \ldots, R_k, \ldots, R_N)$$ [Equation 1]

$$R_k = (x_k, y_k)$$

$$x_k = (2d_k - 1) + p_k \quad y_k = (2Y_k - 1) + q_k$$

A log likelihood ratio with respect to Yk, L (Yk), is defined as represented by Equation 2 shown below:

$$L(Y_k) = \log \frac{Pr(Y_k = 1 \mid R_1^N)}{Pr(Y_k = 0 \mid R_1^N)}$$ [Equation 2]

$$Pr(Y_k = ii \mid R_1^N) : \text{the } APP \text{ of the data bit } Y_k$$

$$\lambda\lambda_k^{ii}(m) = Pr(Y_k = ii, S_k = m \mid R_1^N)$$

$$Pr(Y_k = ii \mid R_1^N) = \sum_{m=0}^{2^\nu - 1} \lambda\lambda_k^{ii}(m)$$

$$L(Y_k) = \log \frac{\sum_{m=0}^{2^\nu - 1} \lambda\lambda_k^1(m)}{\sum_{m=0}^{2^\nu - 1} \lambda\lambda_k^0(m)}$$

$$\hat{Y}_k = \begin{cases} 1; & L(Y_k) \geq 0, \\ 0; & L(Y_k) < 0, \end{cases}$$

Pr is a probability function, and a repeatedly mentioned variable like $\lambda\lambda$ refers to a function with respect to a parity bit.

Equation 2 means that when the value L(Yk) is greater than 0, Yk is decoded into 1, and when the value L(Yk) is smaller than 0, Yk is decoded into 0.

Equation 3 shown below is derived by organizing $\lambda\lambda$ by using the Bayes' rule and the characteristics of a trellis diagram.

$$\lambda\lambda_k^{ii}(m) = \frac{Pr(Y_k = ii, S_k = m, R_1^N)}{Pr(R_1^N)}$$ [Equation 3]

$$= \frac{Pr(Y_k = ii, S_k = m, R_1^k, R_{k+1}^N)}{Pr(R_1^N)};$$

by Bayes' rule $$= \frac{Pr(R_{k+1}^N, Y_k = ii, S_k = m, R_1^k)}{Pr(R_1^N)}$$

$$= \frac{Pr(R_{k+1}^N \mid Y_k = ii, S_k = m, R_1^k) \times Pr(Y_k = ii, S_k = m, R_1^k)}{Pr(R_1^N)}$$

$$= \frac{Pr(Y_k = ii, S_k = m, R_1^k) \times Pr(R_{k+1}^N \mid Y_k = ii, S_k = m)}{Pr(R_1^N)}$$

$$= \frac{\alpha\alpha_k^{ii}(m) \times \beta\beta_k^{ii}(m)}{Pr(R_1^N)}$$

$$\alpha\alpha_k^{ii}(m) = Pr(Y_k = ii, S_k = m, R_1^k)$$

$$\beta\beta_k^{ii}(m) = Pr(R_{k+1}^N \mid Y_k = ii, S_k = m)$$

Here, $\alpha\alpha_k^{ii}(m)$ is calculated in a direction in which the value k increases, so it is called a forward state matric and is defined as represented by Equation 4 shown below:

$$\alpha\alpha_k^{ii}(m) = Pr(Y_k = ii, S_k = m, R_1^k) =$$ [Equation 4]

$$\sum_{m'=0}^{2^\nu - 1} \sum_{jj=0}^{1} \alpha\alpha_{k-1}^{jj}(m') \gamma\gamma_{ii,jj}(R_k, m, m')$$

Here, $\gamma\gamma_{ii,jj}(R_k, m, m')$ is defined as represented by Equation 5 shown below:

$$\gamma\gamma_{ii,jj}(R_k, m, m') = \begin{cases} \delta\delta_{ii}(R_k, m); & m' = S_{bb}^{jj}(m) \\ 0; & m' \neq S_{bb}^{jj}(m) \end{cases}$$ [Equation 5]

$$\delta\delta_{ii}(R_k, m,) = \frac{1}{2} Pr(R_k \mid Y_k = ii, S_k = m)$$

Here, $\delta\delta_{ii}(R_k, m)$ is a value of a reception symbol obtained from a correlation of branches of a trellis diagram structure, which is called a branch matric and is defined as represented by Equation 6 shown below:

$$\delta\delta_{ii}(R_k, m) =$$ [Equation 6]

$$\frac{1}{2} Pr(R_k \mid Y_k = ii, S_k = m) = \exp\left(\frac{2}{\sigma^2}(x_k D_k^{ii}(m) - y_k ii)\right)$$

Thus, the relational expression of Equation 4 can be converted into that as represented by Equation 7 shown below:

$$\alpha\alpha_k^{ii}(m) = \sum_{m'=0}^{2^v-1} \sum_{jj=0}^{1} \alpha\alpha_{k-1}^{jj}(m')\delta\delta_{ii}(R_k, m)$$

$$= \delta\delta_{ii}(R_k, m) \sum_{jj=0}^{1} \alpha\alpha_{k-1}^{jj}(S_{bb}^{jj}(m))$$

$$\delta\delta_{ii}(R_k, m) = \frac{1}{2} Pr(R_k \mid Y_k = ii, S_k = m)$$

[Equation 7]

In Equation 3, $\beta\beta_k^{ii}(m)$ is calculated in a direction in which value k decreases, so it is called a reverse state matric and is defined as represented by Equation 8 shown below:

$$\beta\beta_k^{ii}(m) = Pr(R_{k+1}^N \mid Y_k = ii, S_k = m) =$$

$$\sum_{m'=0}^{2^v-1} \sum_{jj=0}^{1} \beta\beta_{k+1}^{jj}(m') \gamma\gamma_{jj,ii}(R_{k+1}, m', m)$$

[Equation 8]

Here, $\gamma\gamma_{jj,ii}(R_{k+1},m',m)$ is defined as represented by Equation 9.

$$\gamma\gamma_{jj,ii}(R_k, m', m) = \begin{cases} \delta\delta_{jj}(R_{k+1}, m'); & m' = S_f^{ii}(m) \\ 0; & m' \neq S_f^{ii}(m) \end{cases}$$

[Equation 9]

$$\delta\delta_{jj}(R_{k+1}, m',) = \frac{1}{2} Pr(R_{k+1} \mid Y_{k+1} = jj, S_{k+1} = m')$$

Thus, the relational expression of Equation 8 can be converted into that as represented by Equation 10 shown below:

$$\beta\beta_k^{ii}(m) = \sum_{m'=0}^{2^v-1} \sum_{jj=0}^{1} \beta\beta_{k+1}^{jj}(m')\delta\delta_{jj}(R_{k+1}, (S_{ff}^{ii}(m)))$$

[Equation 10]

$$= \sum_{jj=0}^{1} \beta\beta_{k+1}^{jj}(S_{ff}^{ii}(m))\delta\delta_{jj}(R_{k+1}, (S_{ff}^{ii}(m)))$$

Through the foregoing process, the branch matric, the forward state matric, the reverse state matric, and log likelihood ratio with respect to a parity bit can be obtained, and the matrices and the log likelihood ratio can be organized as represented by Equation 11 shown below:

$$\delta\delta_{ii}(R_k, m) = \exp\left(\frac{2}{\sigma^2}(x_k D_k^{ii}(m) - y_k ii)\right)$$

[Equation 11]

$$\alpha\alpha_k^{ii}(m) = \delta\delta_{ii}(R_k, m) \sum_{jj=0}^{1} \alpha\alpha_{k-1}^{jj}(S_{bb}^{jj}(m))$$

$$\beta\beta_k^{ii}(m) = \sum_{jj=0}^{1} \beta\beta_{k+1}^{jj}(S_{ff}^{ii}(m))\delta\delta_{jj}(R_{k+1}, (S_{ff}^{ii}(m)))$$

$$L(Y_k) = \log \frac{\sum_{m=0}^{2^v-1} \alpha\alpha_k^1(m)\beta\beta_k^1(m)}{\sum_{m=0}^{2^v-1} \alpha\alpha_k^0(m)\beta\beta_k^0(m)}$$

In Equation 11, the numerical formula of multiplication can be changed into that of addition by taking a log at both sides of the branch matric, the forward state matric, and the reverse state matric, thus reducing the amount of calculation. This is known as a LogMAP algorithm, and Equation 12 is obtained by employing the LogMAP algorithm.

$$DD_{ii}(R_k, m) = \ln(\delta\delta_{ii}(R_k, m)) = \frac{2}{\sigma^2}(x_k D_k^{ii}(m) - y_k ii)$$

[Equation 12]

$$AA_k^{ii}(m) = \ln(\alpha\alpha_k^{ii}(m)) = DD_{ii}(R_k, m) + \underset{jj=0}{\overset{1}{E}} AA_{k-1}^{jj}(S_{bb}^{jj}(m))$$

$$BB_k^{ii}(m) =$$

$$\ln(\beta\beta_k^{ii}(m)) = \underset{jj=0}{\overset{1}{E}}(BB_{k+1}^{jj}(S_{ff}^{ii}(m)) + DD_{jj}(R_{k+1}, (S_{ff}^{ii}(m))))$$

$$L(Y_k) = \log \frac{\sum_{m=0}^{2^v-1} \alpha\alpha_k^1(m)\beta\beta_k^1(m)}{\sum_{m=0}^{2^v-1} \alpha\alpha_k^0(m)\beta\beta_k^0(m)} =$$

$$\underset{m=0}{\overset{2^v-1}{E}}(AA_k^1(m) + BB_k^1(m)) - \underset{m=0}{\overset{2^v-1}{E}}(AA_k^0(m) + BB_k^0(m))$$

$$\log\left(\sum_{m=0}^{2^v-1} \exp(f(m))\right) =$$

$$\underset{m=0}{\overset{2^v-1}{E}} f(m) = f(0)Ef(1)E \ldots Ef(2^v-1)$$

In this case, on the assumption that an input of the MAP decoder is uniform, the branch matric, the forward state matric, the reverse state matric, and the log likelihood ratio with respect to Yk can be represented by those with respect to an existing dk shown below. Such a conversion can be generally established for a general turbo decoder.

The method of representing the matrices with respect to Yk by the matrices with respect to dk will now be described by applying them to turbo codes of a 3GPP (3rd Generation Partnership Project) LTE (Long-Term Evolution) system.

FIG. 1 is a schematic block diagram illustrating the structure of a turbo encoder used in the conventional 3GPP LTE.

With reference to FIG. 1, a turbo encoder 400 used in the conventional 3GPP LTE may include an interleaver 430 and constituent encoders 410 and 420. The constituent encoders 410 and 420 may include a plurality of adders and flip/flops 411, 413, 415, 421, 423, and 425. A turbo code is also called a PCCC (Parallel Concatenated Convolutional Code).

A coding process thereof is performed by block. N number of information bits d=(d1, d2, Λ, dN) are coded through the first constituent encoder 410 and transmitted, and N number of information bits, whose order has been rearranged by the interleaver 430, are coded through the second constituent encoder 420 and transmitted. Meanwhile, a coding rate may be increased by puncturing an output from the turbo encoder 400 and transmitting the same.

The turbo encoder 400 sets a memory at the side where information bits are input, as upper bits, so pairs of a butterfly structure constituting a trellis diagram are given as follows:

(Sk,Sk+1)=((0,1),(0,4)), ((2,3),(1,5)), ((4,5),(2,6)), ((6,7),(3,7))

Input values calculated with respect to a parity bit in each state according to the butterfly structure and the characteristics of the turbo encoder 400 are shown in Table 1 below:

TABLE 1

| Parity | State of encoder (m) | Input | Inverse coding |
|---|---|---|---|
| 0/1 | 0 | 0/1 | I = ii |
| 0/1 | 1 | 0/1 | I = ii |
| 0/1 | 2 | 1/0 | I = ~ii |
| 0/1 | 3 | 1/0 | I = ~ii |
| 0/1 | 4 | 1/0 | I = ~ii |
| 0/1 | 5 | 1/0 | I = ~ii |
| 0/1 | 6 | 0/1 | I = ii |
| 0/1 | 7 | 0/1 | I = ii |

With reference to Equation 6, a connection relationship between the branch matric with respect to the parity bit and that with respect to input bits are as represented by Equation 13 shown below:

$$\delta\delta_0(R_k, 0) = \exp\left(\frac{2}{\sigma^2}(x_k D_k^0(0) - y_k 0)\right)^{D_k^0(0)=0} =$$

$$\exp\left(\frac{2}{\sigma^2}(x_k 0 - y_k 0)\right) = \delta_0(R_k, 0)$$

$$\delta\delta_1(R_k, 0) = \exp\left(\frac{2}{\sigma^2}(x_k D_k^1(0) - y_k 1)\right)^{D_k^1(0)=1} =$$

$$\exp\left(\frac{2}{\sigma^2}(x_k 1 - y_k 1)\right) = \delta_1(R_k, 0)$$

(ellipsis)

$$\delta\delta_0(R_k, 7) = \exp\left(\frac{2}{\sigma^2}(x_k D_k^0(7) - y_k 0)\right)^{D_k^0(7)=0} =$$

$$\exp\left(\frac{2}{\sigma^2}(x_k 0 - y_k 0)\right) = \delta_0(R_k, 7)$$

$$\delta\delta_1(R_k, 7) = \exp\left(\frac{2}{\sigma^2}(x_k D_k^1(7) - y_k 1)\right)^{D_k^1(7)=1} =$$

$$\exp\left(\frac{2}{\sigma^2}(x_k 1 - y_k 1)\right) = \delta_1(R_k, 7)$$

[Equation 13]

Thus, a relational expression of the branch matric with respect to the parity bit and the branch matric with respect to the input bits is represented by Equation 14 shown below:

$$\delta\delta_{ii}(R_k, m) = \delta_{invEnc(ii,m)}(R_k, m)$$ [Equation 14]

A connection relationship between the forward state matric with respect to the parity bit and that with respect to input bits are as represented by Equation 15 shown below:

$$\alpha\alpha_k^{ii}(0) = \delta\delta_{ii}(R_k, 0)\left[\alpha\alpha_{k-1}^{jj=0}(S_{bb}^{jj=0}(0)) + \alpha\alpha_{k-1}^{jj=1}(S_{bb}^{jj=1}(0))\right]^{ii=i, jj=j}$$

$$= \delta_{ii}(R_k, 0)\left[\alpha_{k-1}^{jj=0}(S_b^{jj=0}(0)) + \alpha_{k-1}^{jj=1}(S_b^{jj=1}(0))\right]$$

$$= \alpha_k^{ii}(0)$$

[Equation 15]

$$\alpha\alpha_k^{ii}(1) = \delta\delta_{ii}(R_k, 1)\left[\alpha\alpha_{k-1}^{jj=0}(S_{bb}^{jj=0}(1)) + \alpha\alpha_{k-1}^{jj=1}(S_{bb}^{jj=1}(1))\right]^{ii=i, jj=\sim j}$$

$$= \delta_{ii}(R_k, 1)\left[\alpha_{k-1}^{\sim jj=0}(S_b^{\sim jj=0}(1)) + \alpha_{k-1}^{\sim jj=1}(S_b^{\sim jj=1}(1))\right]$$

$$= \delta_{ii}(R_k, 1)\left[\alpha_{k-1}^{jj=1}(S_b^{jj=1}(1)) + \alpha_{k-1}^{jj=0}(S_b^{jj=0}(1))\right]$$

$$= \delta_{ii}(R_k, 1)\left[\alpha_{k-1}^{jj=0}(S_b^{jj=0}(1)) + \alpha_{k-1}^{jj=1}(S_b^{jj=1}(1))\right] = \alpha_k^{ii}(1)$$

(ellipsis)

$$\alpha\alpha_k^{ii}(6) = \delta\delta_{ii}(R_k, 6)\left[\alpha\alpha_{k-1}^{jj=0}(S_{bb}^{jj=0}(6)) + \alpha\alpha_{k-1}^{jj=1}(S_{bb}^{jj=1}(6))\right]^{ii=i, jj=\sim j}$$

$$= \delta_{ii}(R_k, 6)\left[\alpha_{k-1}^{\sim jj=0}(S_b^{\sim jj=0}(6)) + \alpha_{k-1}^{\sim jj=1}(S_b^{\sim jj=1}(6))\right]$$

$$= \delta_{ii}(R_k, 6)\left[\alpha_{k-1}^{jj=1}(S_b^{jj=1}(6)) + \alpha_{k-1}^{jj=0}(S_b^{jj=0}(6))\right]$$

$$= \delta_{ii}(R_k, 6)\left[\alpha_{k-1}^{jj=0}(S_b^{jj=0}(6)) + \alpha_{k-1}^{jj=1}(S_b^{jj=1}(6))\right] = \alpha_k^{ii}(6)$$

$$\alpha\alpha_k^{ii}(7) = \delta\delta_{ii}(R_k, 7)\left[\alpha\alpha_{k-1}^{jj=0}(S_{bb}^{jj=0}(7)) + \alpha\alpha_{k-1}^{jj=1}(S_{bb}^{jj=1}(7))\right]^{ii=i, jj=j}$$

$$= \delta_{ii}(R_k, 7)\left[\alpha_{k-1}^{jj=0}(S_b^{jj=0}(7)) + \alpha_{k-1}^{jj=1}(S_b^{jj=1}(7))\right]$$

$$= \alpha_k^{ii}(7)$$

Thus, a relational expression of the forward state matric with respect to the parity bit and the forward state matric with respect to the input bits is represented by Equation 16 shown below:

$$\alpha\alpha_k^{ii}(m) = \alpha_k^{invEnc(ii,m)}(m)$$ [Equation 16]

A connection relationship between the reverse state matric with respect to the parity bit and that with respect to input bits are as represented by Equation 17 shown below:

$$\beta\beta_k^0(0) = \beta\beta_{k+1}^0(S_{ff}^0(0))\delta\delta_0(R_{k+1}, (S_{ff}^0(0))) + \beta\beta_{k+1}^1(S_{ff}^0(0))\delta\delta_1(R_{k+1}, (S_{ff}^0(0)))$$

$$= \beta\beta_{k+1}^0(0)\delta\delta_0(R_{k+1}, 0) + \beta\beta_{k+1}^1(0)\delta\delta_1(R_{k+1}, 0)^{i=ii, j=jj}$$

$$= \beta_{k+1}^0(0)\delta_0(R_{k+1}, 0) + \beta_{k+1}^1(0)\delta_1(R_{k+1}, 0) = \beta_k^0(0)$$

[Equation 17]

$$\beta\beta_k^1(0) = \beta\beta_{k+1}^0(S_{ff}^1(0))\delta\delta_0(R_{k+1}, (S_{ff}^1(0))) + \beta\beta_{k+1}^1(S_{ff}^1(0))\delta\delta_1(R_{k+1}, (S_{ff}^1(0)))$$

$$= \beta\beta_{k+1}^0(4)\delta\delta_0(R_{k+1}, 4) + \beta\beta_{k+1}^1(4)\delta\delta_1(R_{k+1}, 4)^{i=ii, j=\sim jj}$$

$$= \beta_{k+1}^0(4)\delta_1(R_{k+1}, 4) + \beta_{k+1}^1(4)\delta_0(R_{k+1}, 4)$$

$$= \beta_{k+1}^0(4)\delta_0(R_{N-2}, 4) + \beta_{k+1}^1(4)\delta_1(R_{k+1}, 4)$$

$$= \beta_k^1(0)$$

-continued (ellipsis)

$$\beta\beta_k^0(7) = \beta\beta_{k+1}^0(S_{ff}^0(7))\delta\delta_0(R_{k+1},(S_{ff}^0(7))) +$$
$$\beta\beta_{k+1}^1(S_{ff}^0(7))\delta\delta_1(R_{k+1},(S_{ff}^0(7)))$$
$$= \beta\beta_{k+1}^0(3)\delta\delta_0(R_{k+1},3) +$$
$$\beta\beta_{k+1}^1(3)\delta\delta_1(R_{k+1},3)^{i=ii,j=\sim j}$$
$$= \beta_{k+1}^1(3)\delta_1(R_{k+1},3) +$$
$$\beta_{k+1}^0(3)\delta_0(R_{k+1},3)$$
$$= \beta_{k+1}^0(3)\delta_0(R_{N-2},3) +$$
$$\beta_{k+1}^1(3)\delta_1(R_{k+1},3) = \beta_k^0(7)$$

$$\beta\beta_k^1(7) = \beta\beta_{k+1}^0(S_{ff}^1(7))\delta\delta_0(R_{k+1},(S_{ff}^1(7))) +$$
$$\beta\beta_{k+1}^1(S_{ff}^1(7))\delta\delta_1(R_{k+1},(S_{ff}^1(7)))$$
$$= \beta\beta_{k+1}^0(7)\delta\delta_0(R_{k+1},7) +$$
$$\beta\beta_{k+1}^1(7)\delta\delta_1(R_{k+1},7)^{i=ii,j=j}$$
$$= \beta_{k+1}^1(7)\delta_0(R_{k+1},7) +$$
$$\beta_{k+1}^1(7)\delta_1(R_{k+1},7)$$
$$= \beta_k^1(7)$$

Thus, a relational expression of the reverse state matric with respect to the parity bit and the reverse state matric with respect to the input bits is represented by Equation 18 shown below:

$$\beta\beta_k^{ii}(m) = \beta_k^{invEnc(ii,m)}(m) \qquad \text{[Equation 18]}$$

A log likelihood ratio with respect to YK, i.e., L(Yk), obtained by using the relational expressions of Equation 14, Equation 16, and Equation 18 can be represented by Equation 19 shown below:

$$L(Y_k) = \log \frac{\sum_{m=0}^{2^v-1} \alpha\alpha_k^1(m)\beta\beta_k^1(m)}{\sum_{m=0}^{2^v-1} \alpha\alpha_k^0(m)\beta\beta_k^0(m)} \qquad \text{[Equation 19]}$$

$$= \log \frac{\begin{bmatrix} \alpha_k^1(0)\beta_k^1(0) + \alpha_k^1(1)\beta_k^1(1) + \\ \alpha_k^0(2)\beta_k^0(2) + \alpha_k^0(3)\beta_k^0(3) + \\ \alpha_k^0(4)\beta_k^0(4) + \alpha_k^0(5)\beta_k^0(5) + \\ \alpha_k^1(6)\beta_k^1(6) + \alpha_k^1(7)\beta_k^1(7) \end{bmatrix}}{\begin{bmatrix} \alpha_k^0(0)\beta_k^0(0) + \alpha_k^0(1)\beta_k^0(1) + \\ \alpha_k^1(2)\beta_k^1(2) + \alpha_k^1(3)\beta_k^1(3) + \\ \alpha_k^1(4)\beta_k^1(4) + \alpha_k^1(5)\beta_k^1(5) + \\ \alpha_k^0(6)\beta_k^0(6) + \alpha_k^0(7)\beta_k^0(7) \end{bmatrix}}$$

$$= \log \frac{\sum_{m=0}^{2^v-1} \alpha_k^{invEnc(1,m)}(m)\beta_k^{invEnc(1,m)}(m)}{\sum_{m=0}^{2^v-1} \alpha_k^{invEnc(0,m)}(m)\beta_k^{invEnc(0,m)}(m)}$$

With reference to Equation. 19, when the value input to the MAP decoder is uniform, the log likelihood ratio with respect to Yk can be obtained by converting only the index of the state matric used for calculating the log likelihood ratio with respect to the existing dk, without having to calculate it by using the MAP apparatus. Also, the index conversion may be simply performed by using the inverse coding relational expression.

In the case of an MAP used in the related art turbo decoder, turbo decoding is performed by improving only information bits. However, the coding gain of the turbo decoding, a repeated decoding scheme, can be improved and an error floor can be lowered by performing the turbo decoding by improving the parity bit as well as information bits. However, the related art MAP apparatus for turbo decoding cannot calculate the LLR with respect to the parity bit, so in order to improve the parity bit, an additional MAP apparatus for calculating the LLR with respect to the parity bit is required.

In this case, by implementing the MAP apparatus by utilizing the relational expressions of Equations 14, 16, and 18, the LLR for improving parity information bits can be calculated without having to use an additional MAP for improving the parity bit, minimizing the amount of required calculation. Also, by implementing the MAP apparatus by utilizing the relational expressions of Equations 14, 16, and 18, when the Max Log MAP algorithm is adopted, the LLR can be more simply calculated, so the performance of the Max Log MAP can be improved by increasing only a small amount of calculation.

In addition, when the MAP apparatus is implemented by utilizing the relational expressions of Equations 14, 16, and 18, because it can basically provide a posterior probability of the parity information bit as well as that of message information bits, the possibility of a hybrid ARQ combiner can be provided.

In an encoder of a DVC video system, the parity bit is divided and transmitted in order to maximize a compression rate, and when decoding is not completed, a retransmission is performed. In this case, a posterior probability value of the parity information bit can be obtained by applying the MAP according to an exemplary embodiment of the present invention to the decoding operation, so combining can be easily performed by using the parity bit having the improved reliability.

Also, the foregoing developing process can be applicable for a non-binary turbo code to implement a MAP apparatus having improved performance.

The parity generating apparatus and MAP apparatus implemented by using the relational expressions of Equations 14, 16, and 18 will now be described.

Figure 2:
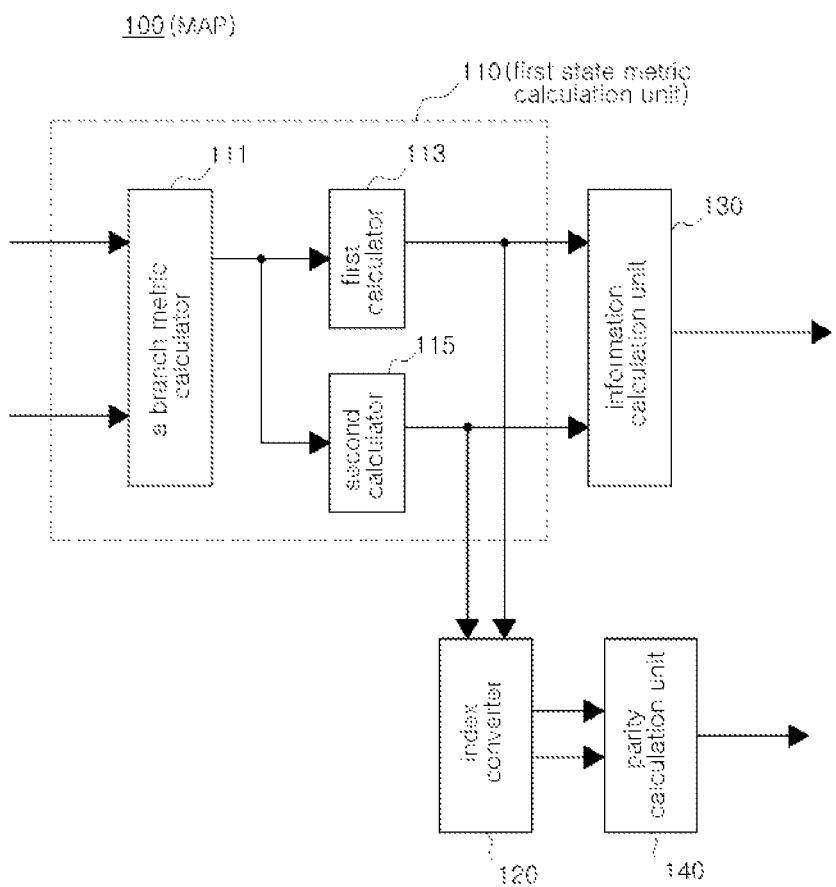
FIG. 2 is a schematic block diagram illustrating function blocks of A MAP (Maximum A Posteriori) apparatus for turbo decoding according to an exemplary embodiment of the present invention.

FIG. 2 is a schematic block diagram illustrating function blocks of A MAP apparatus for turbo decoding according to an exemplary embodiment of the present invention.

With reference to FIG. 2, the MAP apparatus 100 according to an exemplary embodiment of the present invention may include a first state matric calculation unit 110, a index converter 120, a parity calculation unit 140, and an information calculation unit 130.

The first state matric calculation unit 110 may obtain forward and reverse state matrices with respect to input symbols. In order to derive or draw out the forward and reverse state matrices, the MAP algorithm Pietrobon may be used. The forward and reverse state matrices may be obtained for every state of the encoder. The decoder cannot know about an encoding situation of the encoder, so the state matrices with respect to every state of the encoder may be obtained and information bits can be derived by using the obtained state matrices by probability.

The first state matric calculation unit 110 may include a branch matric calculator 111, a first calculator 113, and a second calculator 115.

The branch matric calculator 111 may calculate a branch matric by using a correlation of branches of a trellis diagram structure of the input symbols. The first calculator 113 may calculate a forward state matric of a corresponding period by using the branch matric. The second calculator 115 may calculate a reverse state matric of the corresponding period by using the branch matric.

The index converter 120 may calculate forward and reverse state matrices with respect to a parity bit by maintaining or changing the relationship between the forward and reverse state matrices with respect to information bits and input symbols according to the state of the encoder. In this case, the index converter 120 may simply calculate the forward and reverse state matrices with respect to the parity bit by using the relational expressions of Equation 16 and 18.

Also, the index converter 120 may store a table regarding the relationships among the input symbols, the parity bit, and the decoding state according to the state of the encoder according to a communication system or an video processing system and simply obtain an input status matric from the forward and reverse state matrices with respect to information bits.

The information calculation unit 130 decodes the information bits by using the state matric with respect to the input symbols, and the parity calculation unit 140 may decode the parity bit by using the state matric with respect to the parity bit. Also, the information calculation unit 130 and the parity calculation unit 140 may calculate the information bits and the parity bit by using an LLR algorithm.

The parity generating apparatus according to an exemplary embodiment of the present invention may include the index converter 120 and the parity calculation unit 140.

The first state matric calculation unit 110 and the information calculation unit 130 are included in the related art MAP apparatus, so the parity generating apparatus according to an exemplary embodiment of the present invention may receive only the state matric information, calculate a state matric with respect to the parity bit, and decode the parity bit.

The MAP apparatus 100 can be easily implemented by adding only the index converter 120 and the parity calculation unit 140 to the related art MAP, so the extendibility thereof can be improved.

Figure 3:
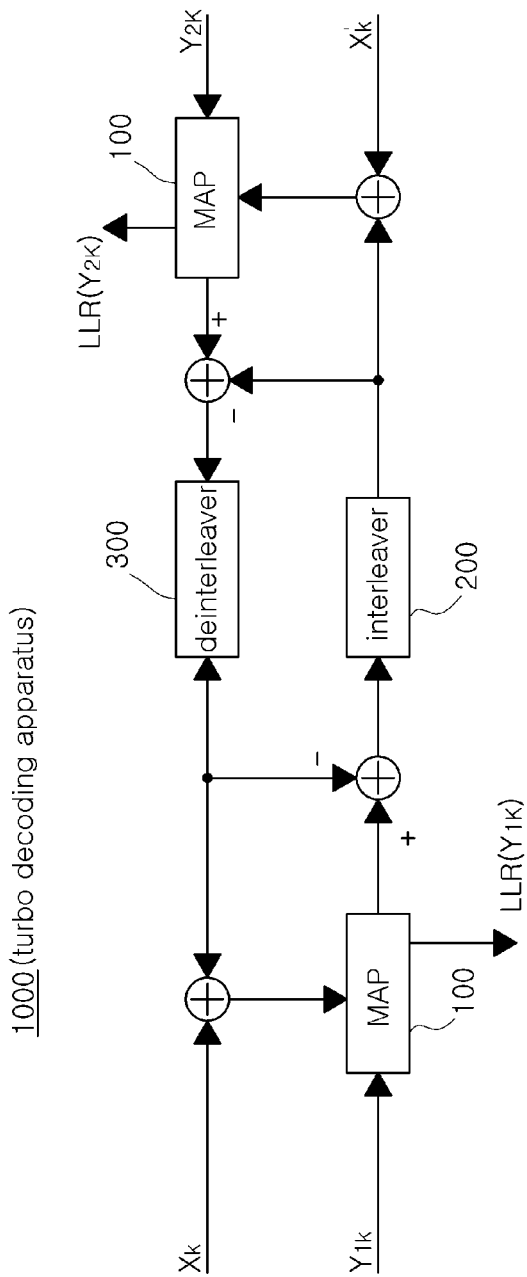
FIG. 3 is a schematic block diagram illustrating function blocks of a turbo decoding apparatus using the MAP apparatus according to an exemplary embodiment of the present invention.

FIG. 3 is a schematic block diagram illustrating function blocks of a turbo decoding apparatus using the MAP apparatus according to an exemplary embodiment of the present invention.

With reference to FIG. 3, a turbo decoding apparatus 1000 may be implemented by disposing the MAP apparatus 100 according to an exemplary embodiment of the present invention at an area where the MAP apparatus of the related art turbo decoding apparatus is to be disposed. The turbo decoding apparatus 1000 has a structure for repeatedly performing a decoding operation. The turbo decoding apparatus 1000 interleaves information bits improved by the MAP apparatus 100 through an interleaver 200 to thus improve the information bits in the MAP apparatus 100 again, and deinterleave the information bits through a deinterleaver 300 to thus improve the information bits in the MAP apparatus 100 still again.

The turbo decoding apparatus 1000 illustrated in FIG. 3 is able to further obtain LLR (Y1$k$) and LLR (Y2$k$) compared with the related art turbo decoding apparatus.

Figure 4:
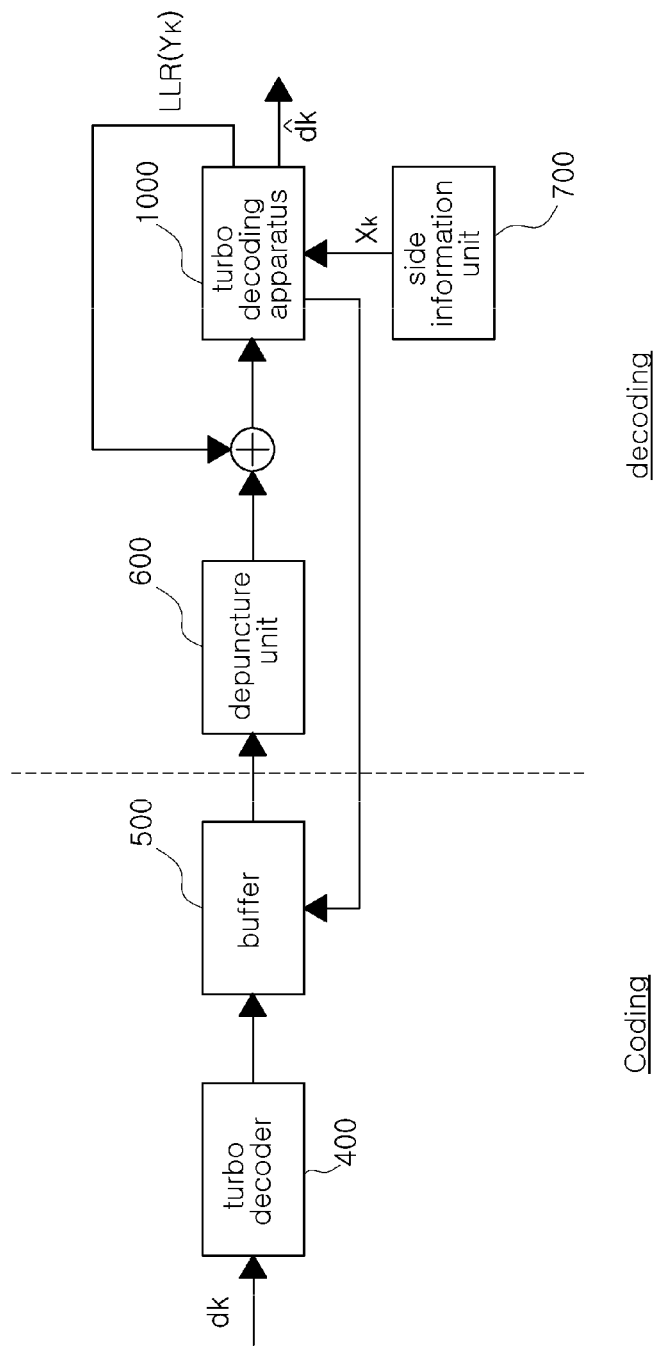
FIG. 4 is a schematic block diagram illustrating function blocks of a distributed video coding system implemented by using the turbo decoding apparatus employing the MAP apparatus according to an exemplary embodiment of the present invention.

FIG. 4 is a schematic block diagram illustrating function blocks of a distributed video coding system implemented by using the turbo decoding apparatus employing the MAP apparatus according to an exemplary embodiment of the present invention.

With reference to FIG. 4, the distributed video coding system may include a turbo decoder 400, a buffer 500, a depuncture unit 600, the turbo decoding apparatus 1000 employing the MAP apparatus according to an exemplary embodiment of the present invention, and an information unit (or a side information unit) 700.

The distributed video coding system performs video coding by utilizing a technique used for an error correction in a communication channel. A data providing side (i.e., a coding side) may transmit only a variation in video information between frames. A data reception side (i.e., a decoding side) may restore video data of a corresponding frame by using previous frame information and the received variation of video information. Information output from the information unit 700 may be video information of the previous frame of the corresponding frame.

Details related to this may be referred to in a treatise entitled "Distributed video coding (B. Girod, A. Aaron, S. Rane and D. Rebollo-Monedero, Proceedings of the IEEE, Special Issue on Video Coding and Delivery, vol. 93, no. 1, pp. 71-83, January 2005. Invited paper)".

In an existing distributed video coding system, decoding is performed without obtaining LLR(Yk), so a Yk value received during a previous period is stored and then used in association with a Yk value received during a corresponding period. Comparatively, in case of the turbo decoding apparatus 1000 employing the MAP apparatus 100 according to an exemplary embodiment of the present invention, because it outputs the LLR (Yk), an improved value of a punctured parity bit, as well as a received parity bit, can be obtained. Thus, because the performance of the turbo decoding apparatus 1000 is improved, the distributed video coding system can also have improved performance.

As set forth above, in the parity generating apparatus and MAP apparatus for turbo decoding according to exemplary embodiments of the invention, because information regarding a parity bit is generated by simply adding a simple calculation process, the amount of information for performing decoding can be significantly increased with a small amount of calculation, improving the decoding performance.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for generating a parity bit for turbo decoding, the apparatus comprising:
   an index converter configured to calculate forward and reverse state metrics with respect to the parity bit using forward and reverse state metrics with respect to information bits by maintaining or changing a relationship between the forward and reverse state metrics with respect to the information bits and input symbols according to an encoder state; and
   a parity calculation unit configured to calculate the parity bit by using the forward and reverse state metrics with respect to the parity bit, which are calculated by the index converter.

2. The apparatus of claim 1, wherein the forward and reverse state metrics with respect to the information bits are calculated according to a MAP (Maximum A Posteriori) algorithm.

3. The apparatus of claim 1, wherein the index converter is configured to maintain or change the relationship between the forward and reverse state metrics with respect to the information bits and the input symbols by using a table regarding a relationship among a decoded state, the parity bit, and the input symbols according to the encoder state.

4. The apparatus of claim 1, wherein the parity calculation unit is configured to calculate the parity bit by employing an LLR (Log Likelihood Ratio) scheme.

5. A MAP (Maximum A Posteriori) apparatus comprising:
- a first state metric calculation unit configured to obtain forward and reverse state metrics with respect to information bits based on input symbols;
- an information calculation unit configured to calculate information bits using the forward and reverse state metrics with respect to the information bits, which are calculated by the first state metric calculation unit;
- an index converter configured to calculate forward and reverse state metrics with respect to a parity bit using the forward and reverse state metrics with respect to the information bits by maintaining or changing a relationship between the forward and reverse state metrics with respect to the information bits and the input symbols according to an encoder state; and
- a parity calculation unit configured to calculate the parity bit using the forward and reverse state metrics with respect to the parity bit, which are calculated by the index converter.

6. The apparatus of claim 5, wherein the forward and reverse state metrics with respect to the information bits are calculated according to a MAP (Maximum A Posteriori) algorithm.

7. The apparatus of claim 6, wherein the first state matric metric calculation unit comprises:
- a branch metric calculator configured to calculate a branch metric by using a correlation of branches of a trellis diagram structure of the input symbols;
- a first calculator configured to calculate the forward state metric of a corresponding period by using the calculated branch metric; and
- a second calculator configured to calculate the reverse state metric of the corresponding period by using the calculated branch matric.

8. The apparatus of claim 5, wherein the parity calculation unit and the information calculation unit are configured to calculate the parity bit and the information bits, respectively, by employing an LLR (Log Likelihood Ratio) scheme.

9. The apparatus of claim 5, wherein the index converter is configured to maintain or change the relationship between the forward and reverse state metrics with respect to the information bits and the input symbols by using a table regarding a relationship among a decoded state, the parity bit, and the input symbols according to the encoder state.

* * * * *